United States Patent [19]

Sawada

[11] Patent Number: 5,424,250
[45] Date of Patent: Jun. 13, 1995

[54] MANUFACTURING METHOD OF ENCAPSULATING SEMICONDUCTOR DEVICE USING TWO RESIN SHEETS HAVING CONVEX PORTIONS

[75] Inventor: Kanako Sawada, Kawasaki, Japan

[73] Assignee: Kabushiki Kaisha Toshiba, Kawasaki, Japan

[21] Appl. No.: 215,815

[22] Filed: Mar. 22, 1994

[30] Foreign Application Priority Data

May 11, 1993 [JP] Japan .................. 5-109381

[51] Int. Cl.⁶ ........................... H01L 21/56
[52] U.S. Cl. ..................... 437/211; 437/207; 437/209; 437/219; 257/788; 257/790; 264/177.1; 264/209.2; 264/284; 264/293
[58] Field of Search ............. 264/177.1, 209.2, 284, 264/293; 437/209, 219, 207, 211; 257/790, 788

[56] References Cited

U.S. PATENT DOCUMENTS 3,911,475 10/1975 Szedon et al. .................. 257/790
5,083,191 1/1992 Ueda ............................. 357/68

FOREIGN PATENT DOCUMENTS 0165333  9/1983  Japan ........................ 437/215
58-165333 9/1983  Japan .
61-163644 7/1986  Japan .
3-14245  1/1991  Japan .
4179242  6/1992  Japan .
5175264  7/1993  Japan .

Primary Examiner—Olik Chaudhuri
Assistant Examiner—Long Pham
Attorney, Agent, or Firm—Finnegan, Henderson Farabow, Garrett & Dunner

[57] ABSTRACT

A method for manufacturing a semiconductor device in which two resin encapsulating sheets, each having a convex portion, are brought into contact with a semiconductor chip. The semiconductor chip is then encapsulated by pressing the chip between the encapsulating sheets.

5 Claims, 7 Drawing Sheets

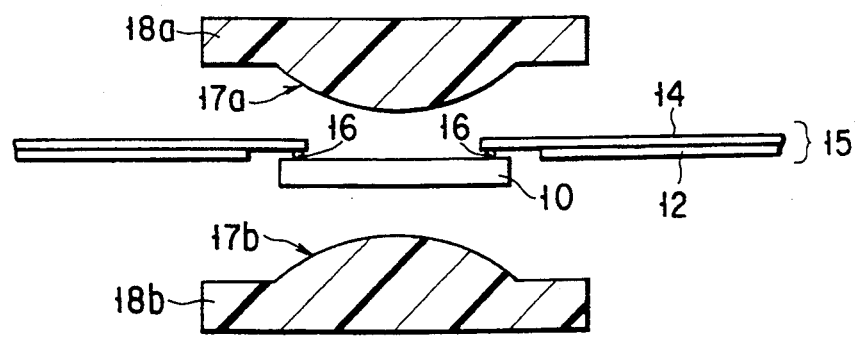
F I G. 1A
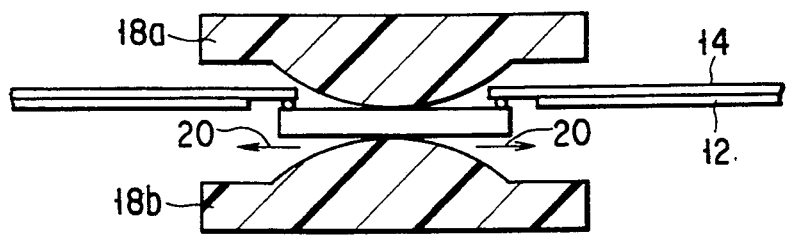
F I G. 1B
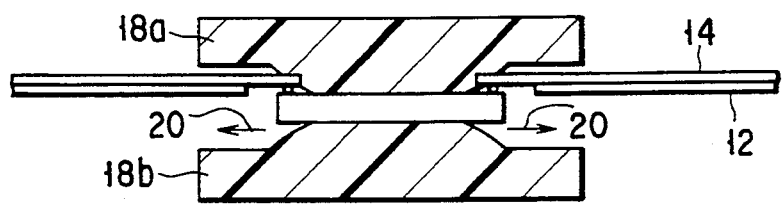
F I G. 1C
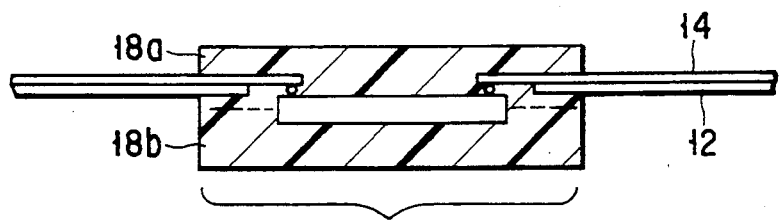
F I G. 1D

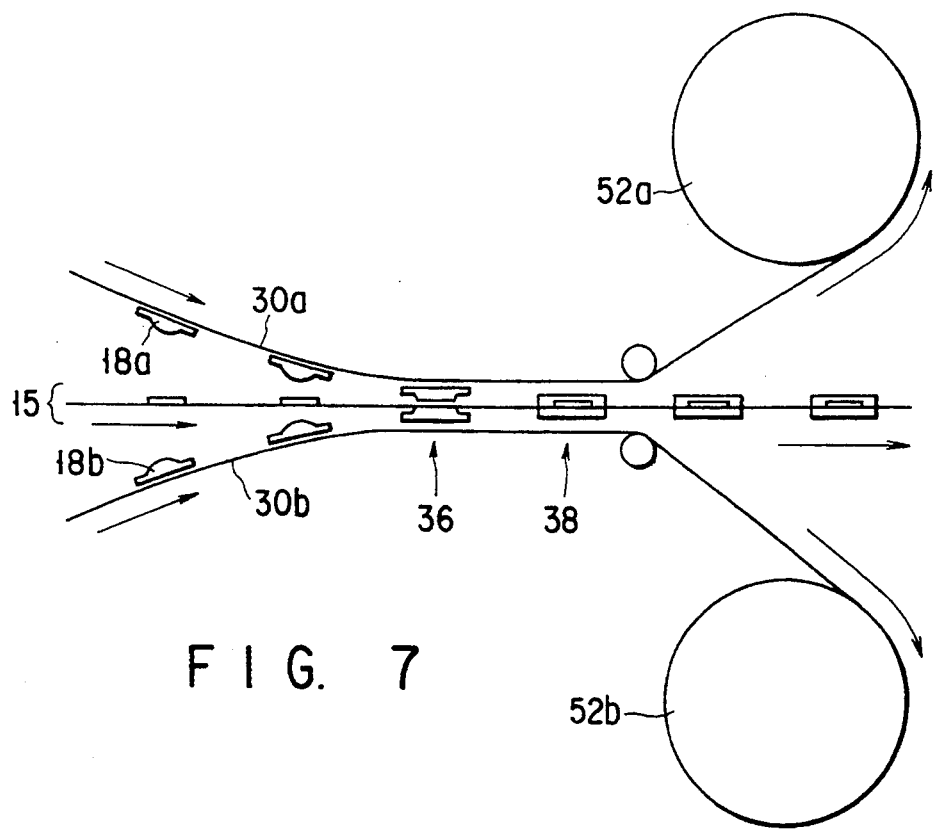
F I G. 7
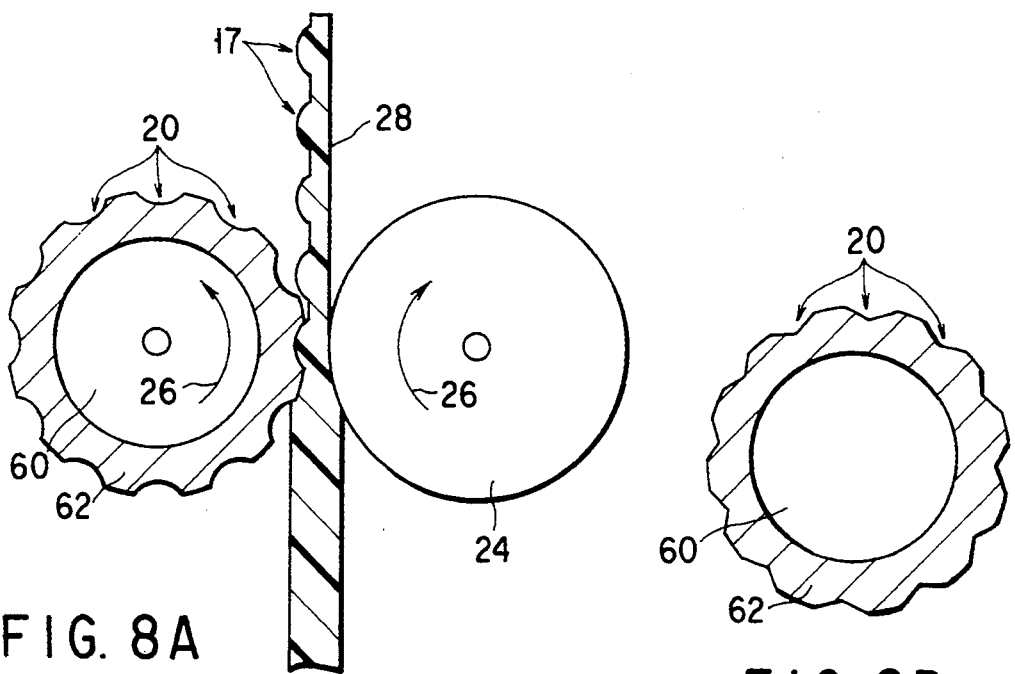
F I G. 8A
F I G. 8B 5,424,250

MANUFACTURING METHOD OF ENCAPSULATING SEMICONDUCTOR DEVICE USING TWO RESIN SHEETS HAVING CONVEX PORTIONS

BACKGROUND OF THE INVENTION

1. Field of the Invention

The present invention relates to a semiconductor device manufacturing method using an encapsulating resin sheet, its manufacturing device, encapsulating resin sheet using the manufacturing method, and its manufacturing method.

2. Description of the Related Art

Conventionally, a semiconductor device of resin encapsulating type was encapsulated by a transfer molding method.

The transfer molding method is explained as follows:

More specifically, uncured resin such as epoxy molding material mainly containing epoxy resin and filler is heated and melted. Then, the melted resin is cast into a mold by a transfer molding machine, and molded in a high temperature and high pressure state to cure resin. Thereby, a semiconductor chip mounted on a lead frame is encapsulated.

The semiconductor device of resin encapsulating type manufactured by the above method has a good reliability since the semiconductor chip is completely coated with an epoxy resin composition. Also, epoxy resin is precisely molded by the mold, a good appearance of a package can be obtained. For these reasons, almost all the semiconductor devices of resin encapsulating type have recently been manufactured by this method.

In recent years, the enlargement of the package of the semiconductor device of resin encapsulating type has been developed due to the enlargement of the chip in accordance with the high integration of the semiconductor device. On the other hand, there is a strong tendency that the package will be thinned in accordance with the reduction of a mounting space. This tendency is considered to be considerably increased in the future. Also, since the types of the packages are diversified, it will be expected that the manufacture cannot be sufficiently performed b the conventional transfer molding method. Under this circumstances, there has been desired the development of a flexible production system, which is the production of the semiconductor device of resin encapsulating type in many types and small quantities.

In consideration of the above point, there has been proposed a method for manufacturing a semiconductor device of resin encapsulating type using an encapsulating resin sheet.

FIGS. 10A to 10C are views showing an example the manufacturing method using the encapsulating resin sheet, and FIGS. 10A to 10C are cross sectional views each showing a main process.

In FIGS. 10A to 10C, reference numeral 100 is a semiconductor chip; 102: a TAB film; 104: a lead formed on the film 102, and 106: a bump electrode formed on the chip 100.

First, the film 102 is moved such that the chip 100 is placed at the position where encapsulating resin sheets 108a and 108b are opposite to each other (FIG. 10A).

Then, the sheet 108a is moved in a direction shown by an arrow 110 so as to sandwich the chip 100 between the sheets 108a and 108b. The sheets 108a and 108b are 10 heated as being pressed by a mold (not shown) (FIG. 10B). If the pressure and heating are performed to some extent, the sheets 108a and 108b are melted each other, and integrally molded. Thereby, the chip 100 is encapsulated (FIG. 10C).

As compared with the transfer molding method, the above method can satisfy the requirement of enlarging and thinning the packages, and is suitable to the production of the semiconductor device of resin encapsulating type in many types and small quantities.

However, as shown in FIG. 11, air is easily left between the chip 100 and the sheet 108a and between the chip 100 and the sheet 108b when molding. As a result, there is a case that air bubble 112 is formed on a portion close to the chip 100 of the passage 109. If air bubble 112 is formed, adhesive properties between the chip 100 and sheets 108a and 108b is lowered. Moreover, there is a problem that the chip 100 will be corroded by reduction of adhesive properties or air bubble 112 itself.

SUMMARY OF THE INVENTION

An object of the present invention is to provide a semiconductor device manufacturing method and its manufacturing device wherein no air is left between a semiconductor chip and encapsulating member when the semiconductor chip is encapsulated, and adhesive properties between the semiconductor chip and encapsulating member can be improved.

Moreover, other object of the present invention is to provide encapsulating member using the manufacturing method and its manufacturing method.

In order to achieve the above objects, according to the present invention, there is provided a method for manufacturing a semiconductor device, comprising the steps of preparing an encapsulating member having convex portions; preparing a semiconductor chip having a surface of an active element where the active element is formed; bringing the convex portions of the encapsulating member into contact with the surface of the active element of the chip; and pressing the encapsulating member to encapsulate the chip.

Also, according to the present invention, there is provided a semiconductor device manufacturing device comprising first supplying means for supplying an encapsulating member having convex portions; second supplying means for supplying a semiconductor chip having a surface of an active element where the active element is formed; contacting means for bringing the convex portions of the encapsulating member supplied by the first supplying means into contact with the surface of the active element of the chip supplied by the second supplying means; and pressing means for pressing the encapsulating member.

Moreover, according to the present invention, there is provided an encapsulating member comprising a member for encapsulating a semiconductor chip, and the member having convex portions on a surface contacting the semiconductor chip.

Furthermore, according to the present invention, there is provided a method for manufacturing an encapsulating member, comprising the steps of approaching a first roll having grooves in its edge portion and a second roll having no groove each other; and passing an encapsulating member between the first and second rolls as rotating the first and second rolls, whereby forming convex portions in the encapsulating member.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 1A to 1D are cross sectional views showing the main processes of a semiconductor device manufacturing method using encapsulating resin sheets of one embodiment of the present invention;

FIG. 2A shows a main part of the sheet manufacturing device used in the manufacturing method of one embodiment of the present invention, and FIG. 2B shows the main part of the device for manufacturing the sheet having the other shape;

FIG. 5A is an enlarged view of the mold, and FIG. 5B is a view showing a state that molds are superimposed on each other;

FIG. 7 is a view schematically showing other specific form of the other manufacturing device used in the manufacturing method of the semiconductor device of one embodiment of the present invention;

FIGS. 8A and 8B are views showing other specific form of the encapsulating resin sheet manufacturing device, FIG. 8A shows the main part of the manufacturing device of the other specific form, and FIG. 8B shows a belt having the other shape;

DETAILED DESCRIPTION OF THE PREFERRED EMBODIMENTS

Figure 2A:
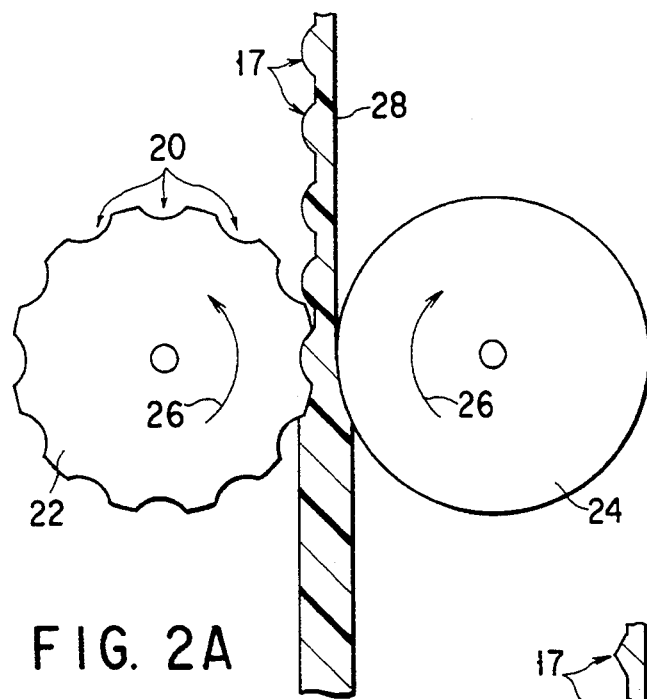
FIGS. 2A and 2B are views showing a manufacturing device for encapsulating resin sheets.

An embodiment of the present invention will be explained with reference to drawings. In the explanation, the same reference numerals are added to the common portions through all figures to avoid repeating the same explanation.

Figure 2B:
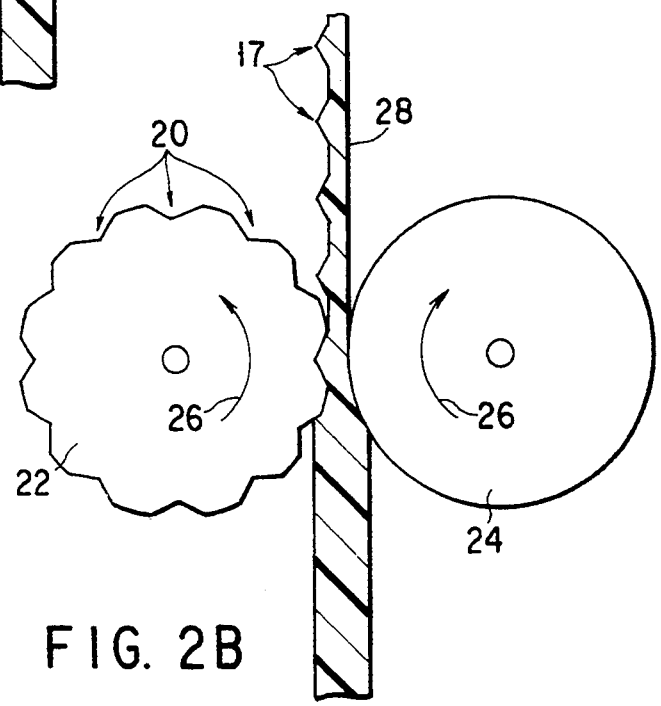
Figure 3:
FIG. 3 is a view showing a state that the encapsulating resin sheet is adhered onto a film tape.
Figure 4:
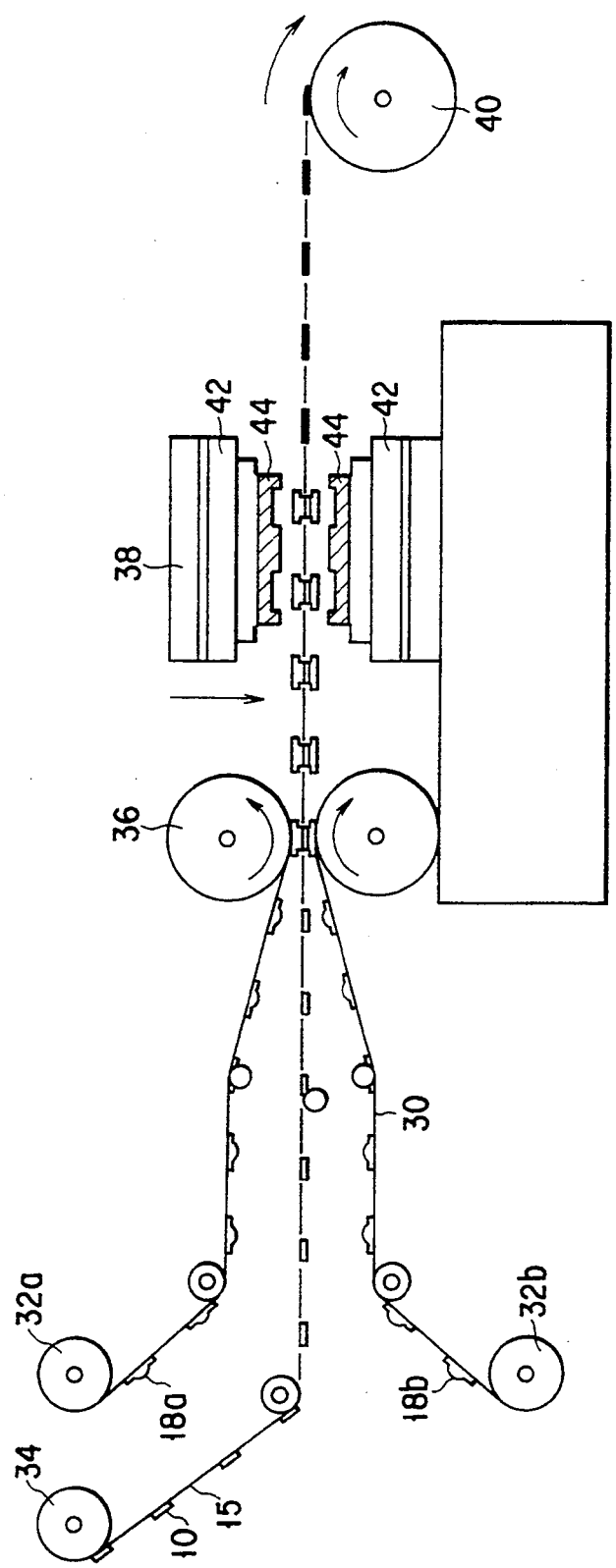
FIG. 4 is a view schematically showing the manufacturing device used in the manufacturing method of the semiconductor device of one embodiment of the present invention.
Figure 5A:
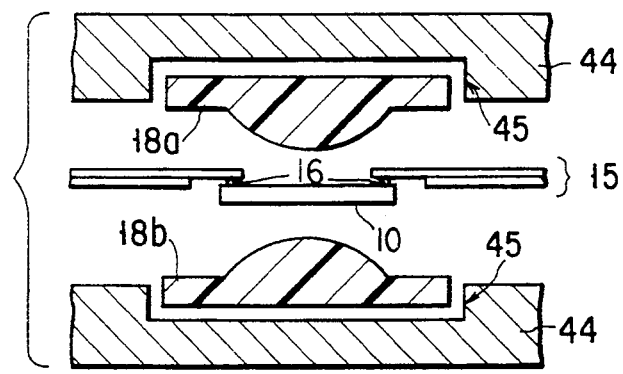
FIGS. 5A and 5B are views showing a mold which the manufacturing device of FIG. 4 has.
Figure 5B:
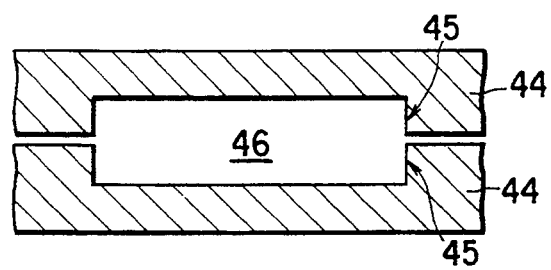

FIGS. 1A to 1D are views showing a manufacturing method of a semiconductor device using using an encapsulating resin sheet according to one embodiment of the present invention; and each of FIGS. 1A to 1D is a cross sectional view showing the main process of the semiconductor device manufacturing method. FIGS. 2A and 2B are a view showing a manufacturing device of the encapsulating resin sheet used in the manufacturing method; FIG. 2A shows a main part of the sheet manufacturing device used in the manufacturing method of one embodiment of the present invention, and FIG. 2B shows the main part of the device for manufacturing the sheet having the other shape. FIG. 3 is a view showing a state that the encapsulating resin sheet is adhered onto a film tape. FIG. 4 is a view schematically showing the manufacturing device used in the manufacturing method. FIGS. 5A and 5B are views showing a mold which the manufacturing device of FIG. 4 has; and FIG. 5A is an enlarged view of the mold, and FIG. 5B is a view showing a state that molds are superimposed on each other;

First, the following will explain the method for manufacturing encapsulating resin sheets.

As shown in FIG. 2A, for manufacturing the encapsulating resin sheet, varnish is prepared by dissolving 100 parts by weight of epoxy resin of phenolic novolak type, 20 parts by weight of ultraviolet-curing acrylate, 6 parts by weight of dicyandiamide serving as curing agent, 300 parts by weight of silica serving as filler and 0.5 parts by weight of benzyldimethylamine in 100 parts by weight of methyl cellossolve. Then, varnish is dipped in a glass cloth, and air-dried, and heated and dried at 80° C. for 4 hours by a drier.

Thereafter, the above heated and dried material is passed between a roll 22 having a plurality of concave grooves 20 in its edge portion and a roll 24 having no groove while the rolls 22 and 24 are rotated in a direction of an arrow 26. Thereby, a tape-shaped or sheet-shaped prepreg 28 on which convex portions 17 are continuously formed is formed.

Then, the prepreg 28 is cut to have a suitable size, thereby obtaining an encapsulating resin sheet 18 having convex portions 17. The obtained sheet 18 is an uncured sheet.

Thereafter, as shown in FIG. 3, the sheets 18 are adhered onto a tape 30 with a suitable distance. The tape 30 is wound around each of supply reels 32a and 32b.

By the above-mentioned method, the encapsulating resin sheet is manufactured, and set in the manufacturing device.

In the case that the encapsulating resin sheet having convex portions 17 is manufactured, the flat encapsulating resin sheet can be compressed and molded, and mechanically cut, or chemical treatment such as fuming nitric acid can be provided thereto.

However, the method in which the encapsulating resin sheet is molded by the roll having grooves and the roll having no groove is advantageous and preferable in view of the easiness of the manufacture and cost.

Moreover, as a material of the encapsulating resin sheet, there can be used uncured thermoset resin, photoset resin, engineering plastic.

However, as the above-explained manufacturing method, uncured thermoset resin is preferably used since resin viscosity is low at the time of integrally molding and encapsulation can be precisely performed.

Also, as a specific method for curing the uncured thermoset resin, in the case of thermoset resin, there can be used a method in which a mold to be used when integrally molding is heated and a method in which only uncured thermo resin is selectively heated by induction heating.

On the other hand, in the case of photoset resin, there can be used a method in which the mold is formed Of a transparent member such as glass and resin is irradiated through the mold.

As thermoset resin, there can be used eoxy resin, polyimide resin, maleimide resin, silicone resin, phenol resin, polyurethane resin, acrylic resin.

On the other hand, as photoset resin, there can be used acrylate, diazonium, diazide, bichromate, and sulfur composition.

These resins may be singly used or combined with each other. Also, curing agent, catalyst, plasticizer, coloring agent, flame retarder, filler, and the other additives may be contained in these resins.

Moreover, in the case that the prepreg is used as an encapsulating resin sheet, as a material of woven textile, there can be used glass, quartz, carbon fiber, silicon carbide, silicon nitride, aluminum nitride, alumina, zirconia, potassium titanate fiber in the case of an inorganic material, and nylon, acrlic, vinylon, polyvinyl chloride, polyester, aramid, phenol, rayon, acetate, cotton, hemp, and silk in the case of an organic material.

These fibers may be singly used or combined with each other. Moreover, uncured resin having a different material can be laminated to be multi-layered, or a metallic layer can be provided between uncured resin layers.

The following will explain a method for manufacturing a film carrier.

In the film carrier manufacturing method, a general manufacturing method is used. In other words, as shown in FIG. 1A, copper foil is adhered onto a TAB film, which is longitudinally extended, and which is formed of polyimide resin, and patterned to form a lead pattern 14. Thereby, a film carrier 15 is formed. Then, a semiconductor chip 10 is connected to the film carrier 15 in a face-down state through a bump electrode 16. Then, the film carrier 15 is wound around a supply reel 34 of the manufacturing device shown FIG. 4. On the chip 10, an active element such as a MOSFET (not shown) is formed on the surface of the side where the bump electrode 16 is formed.

By use of the above-mentioned method, the film carrier is manufactured, and set in the manufacturing device.

The types of leads and chips are not particularly limited. The connection between the lead and chip may be made by a wireless bonding such as a TAB system, or a wiring bonding using a bonding wire.

However, in the above-explained manufacturing method, the wireless bonding such as the TAB system is advantageous to the point that the package is thinned. Also, the wireless bonding is suitable to the manufacture of the semiconductor device of resin encapsulating type for surface mount.

Next, the manufacturing device will be explained as follows.

As shown in FIG. 4, the manufacturing device comprises the supply reels 32a, 32b, and 34, an adhering section 36 for adhering the film carrier 15 and sheet 18 which are superimposed on each other and pressed, a compression molding machine 38, and a winding reel 40. Reference numeral 42 is a heater attached to the molding machine 38, and 44 is a mold, which is similarly attached to the molding machine 39.

As shown in FIG. 5A, each of the molds 44 has a concave portion 45. The concave portions 45 correspond to an upper side sheet 18a and a lower side sheet 18b, respectively. Then, as shown in FIG. 5B, a volume of a cavity 45, which can be obtained by superimposing the concave portions 45 on each other, is set to be slightly smaller than the total volume of the sheets 18a and 18b, a semiconductor chip 10, a bump electrode 16 and a molded portion of a film carrier 15, so that the encapsulating resin sheet can be pressed at the time of molding.

By use of the above manufacturing device, the upper side sheet 18a, film carrier 15, and lower side sheet 18b (see FIG. 1A) are moved between each of the supply reels 32a, 32b, 34 and the reel 40 and superimposed on each other to be continuously mounted.

Next, the manufacturing method of the semiconductor device using the encapsulating resin sheet will be explained as follows.

As shown in FIGS. 1A to 1D and FIG. 4, at the adhering section 36, the sheet 18a, film carrier 15, and sheet 18b are superimposed to conform to the position of the chip 10. At this time, the convex portion 17a of the sheet 18a and the convex portion 17b of the sheet 18b are opposite to each other.

Then, by use of the molding machine 38, these materials are compressed and molded in the mold 44, which is heated at 170° C. for one minute by the heater 42, thereby forming a package 19 shown in FIG. 1D. In this case, as shown in FIG. 1B, the sheets 18a and 18b are simply brought into contact with the chip 10 in the vicinity of the center of the chip 10 at first. However, as pressure is applied to the contact surface by the mold 44, the contact surface is gradually extended to the periphery from the center of the chip 10. In accordance with the extension, air between the sheets 18a, 18b and the chip 10 is gradually pressed outside as shown by an arrow 20.

By use of the above-mentioned manufacturing method, there can be manufactured the package 19 in which air bubble is not easily formed at the boundary surface between the sheets 18a, 18b and the chip 10 as shown in FIG. 1D.

Thereafter, the molded package 19 is detached from the mold 44, and wound by the winding reel 40, and after-cured at 180° C. for 4 hours by an after-curing section (not shown). Thereby, resin is completely cured.

Finally, the package is deflashed, and divided into each semiconductor device, so that the semiconductor device is completed.

In the semiconductor device obtained by the above manufacturing method, air bubble is not formed at the boundary surface between the chip and resin, and adhesive properties can be improved. Due to this, corrosion of the chip 10 is little generated. Therefore, the semiconductor device obtained by the above manufacturing method has high reliability.

Moreover, in the semiconductor device obtained by the above manufacturing method, since the encapsulating resin sheet is used, there is an advantage in that the thickness of the package can be extremely thinned as compared with the semiconductor device, which is manufactured by the transfer molding method.

The manufacturing device used in the manufacturing method of the present invention is not limited to the manufacturing device of FIG. 4. The present invention can be worked by the following manufacturing device.

Figure 6:
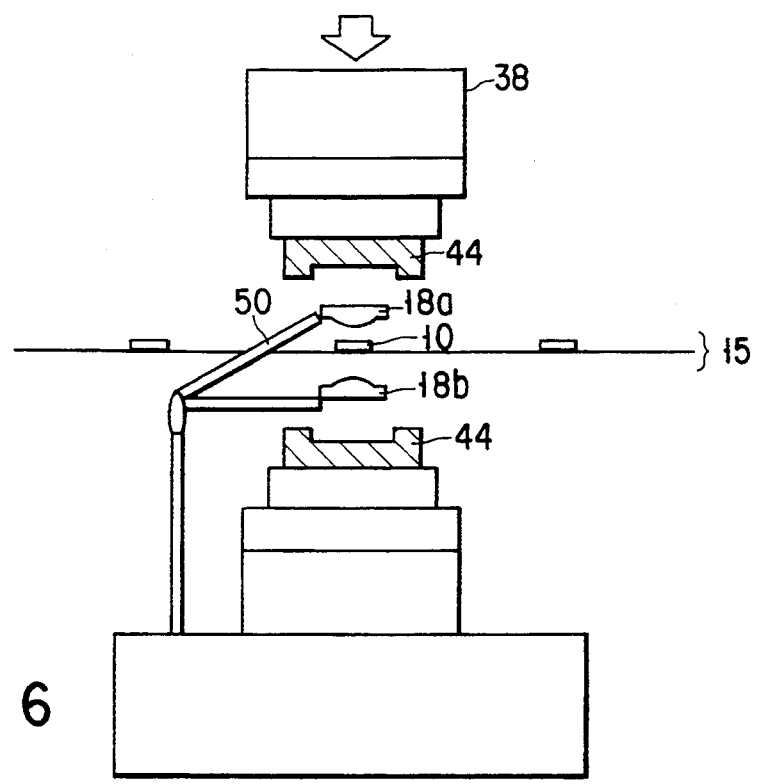
FIG. 6 is a view schematically showing a specific form of the other manufacturing device used in the manufacturing method of the semiconductor device of one embodiment of the present invention.

FIG. 6 is a view schematically showing a first specific form of the other manufacturing device.

As shown in FIG. 6, the adhesion of the sheets 18a and 18b and its press-molding may be performed by the same device (position). In the first specific form of the other manufacturing device, a sheet supplying machine 50 is provided close to the compression molding machine 38. When the chip 10 mounted on the film carrier 15 reaches the mold 44, the sheets 18a and 18b are adhered to both surfaces of the chip 10. Then, these materials are heated by the heater 42 and press-molded by the mold 44, so that the chip is encapsulated. 10 FIG. 7 is a view schematically showing a second specific form of the other manufacturing device.

As shown in FIG. 7, the sheets 18a and 18b are mounted on tapes 30a and 30b, respectively, and continuously supplied. Then, the sheets 18a and 18b are adhered to both surfaces of the chip 30, which is mounted on the film carrier 15, while being positioned by the adhering section 36. Thereafter, the sheets are press-molded by the mold (not shown) of the compression molding machine 38. Then, the tapes 30a and 30b are wound by winding reels 52a and 52b, respectively.

The manufacturing device of the encapsulating resin sheet is not limited to the manufacturing device of FIGS. 2A and 2B.

FIG. 8A shows the main part of the manufacturing device of the other specific form of the manufacturing device of the encapsulating resin sheet.

As shown in FIG. 8A, there is no need that grooves are not directly formed on the edge portion of the roll. In other words, a detachable belt 62 is wound around the roller 60, and grooves 20 may be formed on the belt 62. Also, as shown in FIG. 8B, if various types of belts 62 having variously shaped grooves 20 are prepared, sheets having variously shaped convex portions can be easily formed by only exchanging the belt 62 for new one.

The following will explain various modifications of the shape of the encapsulating resin sheet of the present invention.

FIGS. 9A to 9H are views showing encapsulating sheets, and FIGS. 9A to 9H are perspective views showing the encapsulating sheet every shape.

Figure 9A:
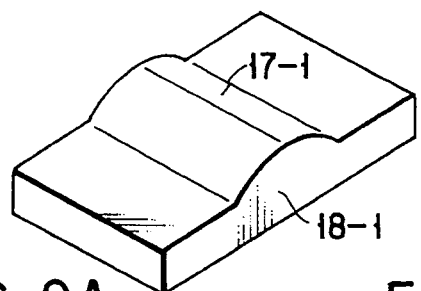
FIGS. 9A to 9H are perspective views showing the encapsulating sheet every shape.

A sheet 18-1 shown in FIG. 9A shows the sheet used in the above-explained embodiment. In other words, a convex portion 17-1 having a semicircular cross section is formed from one end portion of the sheet 18-1 to the other end portion. The shape of the convex portion of such a sheet can be variously deformed as shown in FIGS. 9B to 9H.

Figure 9E:
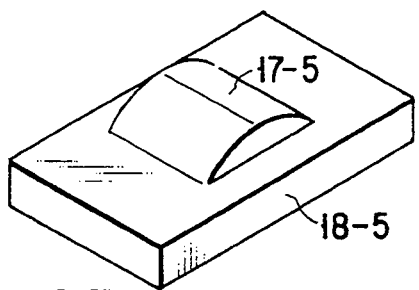
Figure 9B:
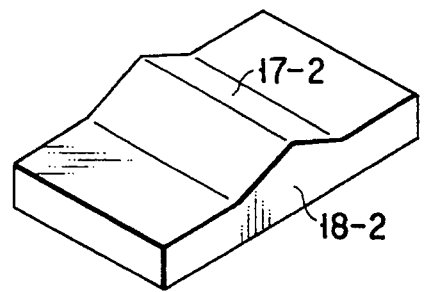

First, in a sheet 18-2 shown in FIG. 9B, a convex portion 17-2 having a triangular cross section is formed from one end portion of the sheet 18-1 to the other end portion.

The sheet 18-2 can be obtained by shaping the grooves 20, which the roll 22 of the sheet manufacturing device has, to be triangular as shown in FIG. 2B. In the sheet manufacturing device of the other specific form, the sheet 18-2 can be obtained by shaping the grooves 20 of the belt 62 to be triangular as shown in FIG. 8B.

The sheet shown in FIG. 9B has an advantage in that processing of the grooves 20 of the roll 22 is easier than the sheet having a circular arc shown in FIG. 9A.

Figure 9F:
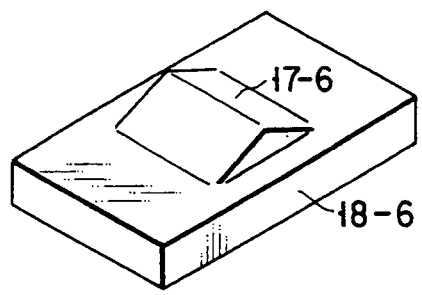
Figure 9C:
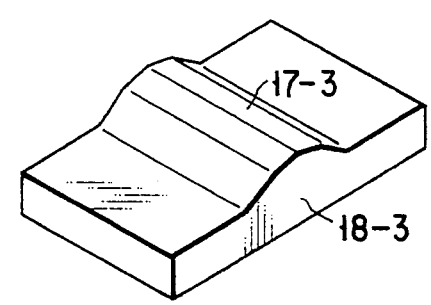

In a sheet 18-3 shown in FIG. 9C, a convex portion 17-3 having a pentagonal cross section is formed from one end portion of the sheet 18-3 to the other end portion.

Figure 9G:
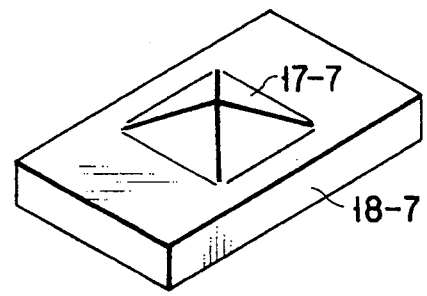
Figure 9D:
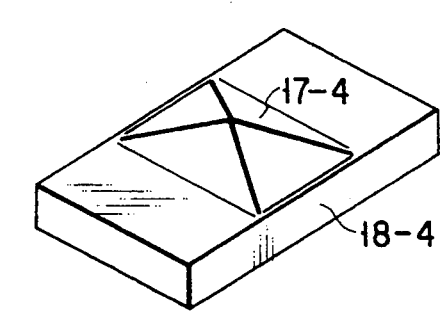

In a sheet 18-4 shown in FIG. 9D, a convex portion 17-4 having a cross section of a quadrangular pyramid is formed from one end portion of the sheet 18-4 to the other end portion.

In a sheet 18-5 shown in FIG. 9E, a convex portion 17-5 having a semicircular cross section is formed on only a portion close to the central portion of the sheet 18-5.

In a sheet 18-6 shown in FIG. 9F, a convex portion 17-6 having a triangular cross section is formed on only a portion close to the central portion of the sheet 18-6.

In a sheet 18-7 shown in FIG. 9G, a convex portion 17-7 of a quadrangular pylamid is formed on only a portion close to the central portion of the sheet 18-7.

Figure 9H:
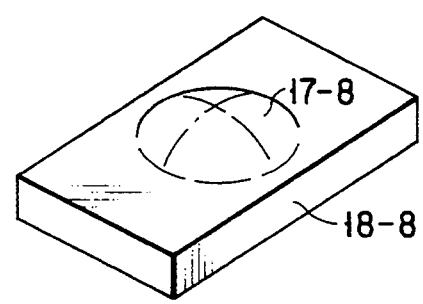
Figure 10A:
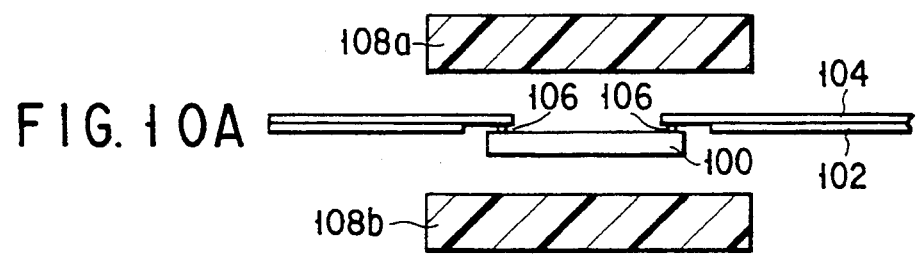
FIGS. 10A to 10C are cross sectional views showing the main processes of the manufacturing method of the semiconductor device using the typical encapsulating resin sheet.
Figure 10B:
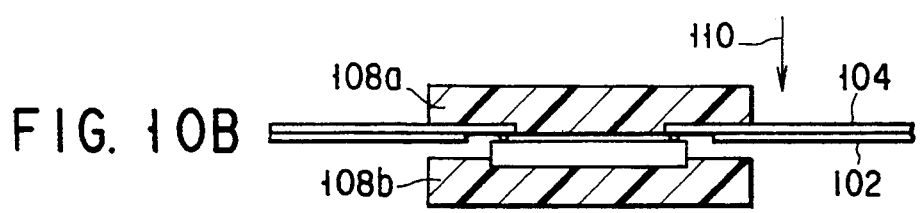
Figure 10C:
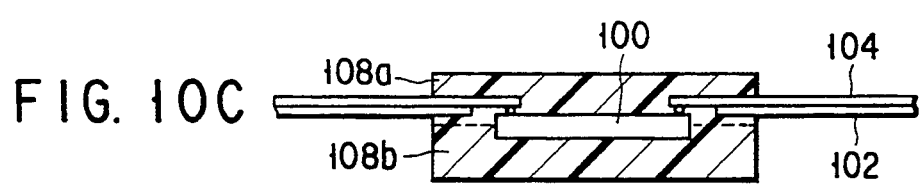
Figure 11:
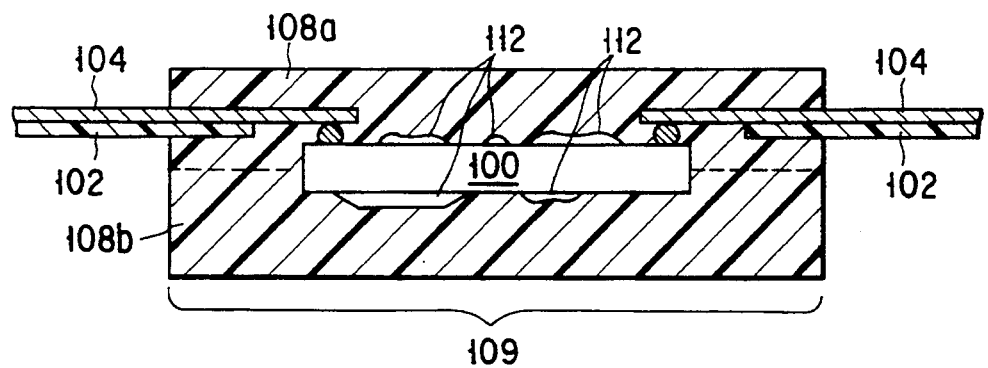
FIG. 11 is a cross sectional view of the semiconductor device obtained by the manufacturing method of FIGS. 10A to 10C.

In a sheet 18-8 shown in FIG. 9H, a domed convex portion 17-8 is formed on only a portion close to the central portion of the sheet 18-8.

In any sheets shown in FIGS. 9B to 9H, the top portion of the convex portion contacts the surface of the chip, and pressed, so that the contact surface between the convex portion and the chip is extended to the outside. Due to this, air on the surface of the chip is little left. Therefore, the same technical advantage as the sheet 18-1, that is the above embodiment, can be obtained. Regarding the shape of the convex portion, other shapes can be used.

According to the above-explained semiconductor device manufacturing device of the embodiment of the present invention, the encapsulating resin sheet, which has a convex portion, and is formed of uncured resin, is used. Then, in order to provide the convex portion toward the chip surface, and to integrally press-mold the sheet, the top portion of the convex portion first contacts the chip surface when molding. In other words, the central portion of the chip first contacts the sheet. As the molding is performed, the contact surface between the sheet and chip is gradually extended from the central portion of the chip to the outside of the chip. Due to this, air between the encapsulating resin sheet and the chip is pressed outside. Therefore, the resin sheet can be molded without leaving air between the sheet and the chip, and generation of air bubble can be prevented. Therefore, the adhesion between the sheet and the chip can be improved.

Moreover, since the encapsulating resin sheets are encapsulated to be opposite to the chip and lead in advance, good encapsulation can be realized even if viscosity is large in melting as compared with the transfer molding method. Therefore, the molding using resin having a smaller coefficient of thermal expansion can be performed, so that there can be obtained the package having high mechanical strength and small thermal stress. Due to this, in the case of the package of super-thin type, the chap can be encapsulated well without generating any cracks. At this time, if the prepreg is used as an encapsulating resin sheet as in the above embodiment, the mechanical strength can be further improved.

Moreover, according to the above-explained semiconductor device manufacturing device of the embodiment of the present invention, since the manufacturing device particularly shown in FIG. 4 is used, the automatic manufacture can be performed by an in-line of the encapsulating process, and it is possible to sufficiently satisfy the requirement of the production of the semiconductor device in many types and small quantities. Particularly, since the film carrier and the sheets can be supplied by the reel system, both the film carrier and the sheets are supplied by the corresponding reel, and adhered and encapsulated, thereby the processing including the assembly of the semiconductor device to the encapsulation can be performed in the continuous process.

Furthermore, according to the present invention, resin, curing agent, catalyst, filler, and other materials are crushed, mixed, and melted, and supplied to the rolls, so that the encapsulating resin sheets used in the present invention are manufactured. Moreover, in the case that the prepreg is manufactured as the encapsulating resin sheet, resin, curing agent, catalyst, filler, and other materials are crushed, mixed, and dissolved in solvent such as acenton, and supplied to the rolls, so that the prepreg is manufactured. According to the manufacturing method of the encapsulating resin sheet explained in the above embodiment, the encapsulating resin sheet formed of uncured resin is molded by the roll having grooves and the roll having no groove. Due to this, the sheet having convex portions can be easily manufactured without increasing the number of processes for forming the convex portions in the sheet.

Moreover, according to the above embodiment, two encapsulating resin sheets having convex portions were used and the chip was capsulated from both sides of the chip. However, one encapsulating resin sheet is used, and the semiconductor chip may be encapsulated from one side of the chip.

The number of sheets is suitably selected, depending on the form of the connection between the lead and the chip. For example, in the form that the chip is connected to the lead frame by wiring bonding, the chip is capsulated from the both side of the chip by use of two resin sheets. Or, the encapsulating resin sheet is provided on only the surface of the active element of the chip, thereby encapsulating the chip. Furthermore, in the form that the chip is mounted on the substrate in a face-up state, the chip is encapsulated from one side of the chip by one encapsulating resin sheet.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method for manufacturing a semiconductor device, comprising the steps of:
   preparing first and second encapsulating members, each having a convex portion;
   preparing a semiconductor chip having an obverse surface where at least one active element is formed, and a reverse surface opposite said obverse surface;
   bringing the convex portion of said first encapsulating member into contact with the obverse surface of said chip and bringing the convex portion of said second encapsulating member into contact with the reverse surface of said chip; and
   encapsulating said chip by pressing said first and second encapsulating members.

2. The method according to claim 1, wherein the convex portions of said first and second encapsulating members are formed such that contact surfaces are created when the convex portions contact the obverse and reverse surfaces of said chip and such that the contact surfaces gradually extend to the periphery from the center of the chip, thereby pressing air outside from between the members when said first and second encapsulating members are pressed.

3. The method according to claim 1, wherein each of the convex portions has a semicircular cross sectional shape.

4. The method according to claim 1, wherein each of the convex portions has a polygonal cross sectional shape.

5. The method according to claim 1, wherein said first and second encapsulating members are pressed and heated in the step of encapsulating said chip.

* * * * *